United States Patent
Holland

(10) Patent No.: US 11,706,903 B2
(45) Date of Patent: Jul. 18, 2023

(54) THERMAL MANAGEMENT SYSTEM

(71) Applicant: BAE SYSTEMS plc, London (GB)

(72) Inventor: Graham Andrew Holland, Preston Lancashire (GB)

(73) Assignee: BAE SYSTEMS PLC, London (GB)

( * ) Notice: Subject to any disclaimer, the term of this patent is extended or adjusted under 35 U.S.C. 154(b) by 95 days.

(21) Appl. No.: 17/261,734

(22) PCT Filed: Jul. 19, 2019

(86) PCT No.: PCT/GB2019/052027
§ 371 (c)(1),
(2) Date: Jan. 20, 2021

(87) PCT Pub. No.: WO2020/016597
PCT Pub. Date: Jan. 23, 2020

(65) Prior Publication Data
US 2021/0274681 A1    Sep. 2, 2021

(30) Foreign Application Priority Data
Jul. 20, 2018   (GB) ..................................... 1811856

(51) Int. Cl.
*H05K 7/20*    (2006.01)
(52) U.S. Cl.
CPC ..... *H05K 7/20281* (2013.01); *H05K 7/20263* (2013.01); *H05K 7/20272* (2013.01)
(58) Field of Classification Search
None
See application file for complete search history.

(56) References Cited

U.S. PATENT DOCUMENTS

| | | | |
|---|---|---|---|
| 3,251,405 | A | 5/1966 | Hallstrom |
| 3,773,031 | A | 11/1973 | Laing et al. |
| 3,848,416 | A | 11/1974 | Bundy |
| 3,943,325 | A | 3/1976 | Pickard |
| 4,193,271 | A | 3/1980 | Honigsbaum |

(Continued)

FOREIGN PATENT DOCUMENTS

| CN | 107421030 A | 12/2017 |
|---|---|---|
| CN | 108336445 A | 7/2018 |

(Continued)

OTHER PUBLICATIONS

International Search Report and Written Opinion received for PCT Application No. PCT/GB2019/052027, dated Sep. 24, 2019. 11 pages.

(Continued)

*Primary Examiner* — Courtney L Smith
(74) *Attorney, Agent, or Firm* — Finch & Maloney PLLC

(57) ABSTRACT

The present invention relates to an improved thermal management system for a heat source, such as a high-powered electronic device. Thermal management systems work to maintain the optimal operational temperature of a device to maximise reliability, operational lifespan and/or efficiency, for example by using a fluid coolant to transfer thermal energy from the device to a heat exchanger. The present invention seeks to provide an improved thermal management system by incorporating a phase change material into a heat exchanger.

8 Claims, 10 Drawing Sheets

(56) References Cited

U.S. PATENT DOCUMENTS

| | | | |
|---|---|---|---|
| 4,807,696 A | 2/1989 | Colvin et al. | |
| 5,687,706 A | 11/1997 | Goswami et al. | |
| 6,447,692 B1 | 9/2002 | Momoda et al. | |
| 9,681,589 B1* | 6/2017 | Ross | H05K 7/2029 |
| 2004/0237911 A1 | 12/2004 | Sano | |
| 2005/0174733 A1* | 8/2005 | Novotny | G06F 1/206 |
| | | | 361/695 |
| 2008/0084666 A1* | 4/2008 | Kehl | H05K 7/20672 |
| | | | 361/700 |
| 2009/0086434 A1* | 4/2009 | Hodes | H05K 7/20609 |
| | | | 361/700 |
| 2009/0194257 A1 | 8/2009 | Niu et al. | |
| 2009/0211732 A1 | 8/2009 | Goenka | |
| 2011/0315783 A1* | 12/2011 | Baker | B01L 1/025 |
| | | | 236/3 |
| 2012/0018116 A1 | 1/2012 | Mathur et al. | |
| 2012/0128869 A1* | 5/2012 | Miller | C09K 5/063 |
| | | | 252/78.3 |
| 2013/0034732 A1* | 2/2013 | Parker | C09K 5/063 |
| | | | 252/74 |
| 2014/0102662 A1* | 4/2014 | Grama | F28D 20/023 |
| | | | 165/10 |
| 2014/0166232 A1* | 6/2014 | Al-Hallaj | F24T 10/15 |
| | | | 165/11.1 |
| 2015/0360541 A1 | 12/2015 | Schwartz et al. | |
| 2016/0201995 A1 | 7/2016 | Oliva Llena et al. | |
| 2017/0127563 A1 | 5/2017 | Chainer et al. | |
| 2017/0219294 A1* | 8/2017 | Longis | C09K 5/063 |
| 2017/0276435 A1 | 9/2017 | Papadopoulos et al. | |
| 2017/0363368 A1 | 12/2017 | Bergan et al. | |
| 2018/0287231 A1 | 10/2018 | Iyengar et al. | |
| 2021/0262739 A1 | 8/2021 | Holland | |

FOREIGN PATENT DOCUMENTS

| | | |
|---|---|---|
| DE | 102008013657 A1 | 9/2009 |
| DE | 102015108994 A1 | 12/2015 |
| EP | 2805862 A1 | 11/2014 |
| JP | S5860193 A | 4/1983 |
| JP | S59134455 A1 | 8/1984 |
| JP | H01163597 A | 6/1989 |
| WO | 0212413 A2 | 2/2002 |
| WO | 2004009728 A1 | 1/2004 |
| WO | 2020016597 A1 | 1/2020 |
| WO | 2020016598 A1 | 1/2020 |

OTHER PUBLICATIONS

GB Search Report under Section 17(5) received for GB Application No. 1811856.2 dated Jan. 16, 2019. 4 pages.

International Search Report and Written Opinion received for PCT Application No. PCT/GB2019/052028, dated Sep. 25, 2019. 13 pages.

GB Search Report under Section 17(5) received for GB Application No. 1811860.4 dated Dec. 14, 2018. 3 pages.

International Preliminary Report on Patentability received for PCT Application No. PCT/GB2019/052028, dated Feb. 4, 2021. 7 pages.

International Preliminary Report on Patentability received for PCT Application No. PCT/GB2019/052027, dated Feb. 4, 2021. 7 pages.

* cited by examiner

THERMAL MANAGEMENT SYSTEM

FIELD OF THE INVENTION

The present invention relates to an improved thermal management system for a heat source, such as a high-powered electronic device.

BACKGROUND

Electronic devices produce excess heat in use, and require thermal management in order to maintain their optimal operational temperature levels. Operating such a device in temperatures above (or below) the optimal temperature range will negatively impact the reliability, operational lifespan and/or efficiency of the device. Therefore thermal management systems work to maintain the optimal operational temperature of the device to maximise reliability, operational lifespan and/or efficiency.

Thermal management systems are designed to regulate and/or control the temperature of operational devices. An example component is a heat exchanger, which is designed to transfer heat away from a heat source, e.g. from an operational electronic device. Thermal energy may be extracted directly from the device by a heat exchanger, or by using a fluid coolant to transfer thermal energy from the device to the heat exchanger. Coolants typically have a high thermal capacity and therefore can hold large amounts of thermal energy. An example of a heat exchanger is found in an internal combustion engine in which engine coolant flows through the heat source (the engine itself). The coolant transfers heat away from the engine, heating up as it does so, and subsequently cooling down the engine. The heated coolant passes through radiator coils, and as air flows past the coils, thermal energy is transferred from the coolant, cooling it, to the incoming air. The thermal energy is carried away by the heated air.

The present invention seeks to provide an improved thermal management system for a thermal load, i.e. heat source, such as an electronic device.

SUMMARY

According to one aspect of the invention there is provided a thermal management system comprising a fluid coolant, a pump, and a heat exchanger. The heat exchanger comprises an encapsulated PCM through which the fluid coolant passes. This helps improve the efficiency of the heat exchanger to be able to extract thermal energy from the fluid coolant.

In one example, the heat exchanger comprises a porous mesh, and the encapsulated PCM is incorporated as particles suspended in the fluid coolant flow. The porous mesh gap size is smaller than the PCM particle size which constrains the PCM particles in a containment area, but through which the fluid coolant may pass. This means that the fluid may flow unobstructed through the system. Preferably, the encapsulated PCM particles are formed of multiple smaller PCM particles combined together. This means that a large mesh gap size can be used, further reducing the obstruction to the fluid coolant.

In another example, the heat exchanges comprises a porous foam, a matrix of tube cavities or mesh incorporating encapsulated PCM particles, through which the fluid coolant flows. This provides a rigid structure through which the fluid coolant may pass, and transfer thermal energy to the encapsulated PCM.

In another example, the thermal management system is coupled to a wider fuel system for another device, and the fluid coolant is a fuel source for the other device. This means that in systems where weight or size might be an issue (for example, in aircraft) that the fluid coolant may also act as a fuel, thus reducing weight and size of the overall system.

In another example, more than one type of PCM may be used, each different type of PCM having a different melting point. This allows the thermal management system to customise the thermal response of the PCM, i.e. the heat capacity profile, and the performance of the thermal management system.

In another example, the thermal management system comprises a temperature control unit (TCU) through which the coolant flows after the heat exchanger and before the heat source. The TCU is adapted to heat the fluid coolant to a pre-determined temperature. This ensures that the fluid coolant is most efficiently able to absorb heat from a heat source, and transfer it away, thus cooling a heat source to the optimal operating temperature. Preferably, the TCU comprises a thermometer to measure the temperature of the fluid coolant, a TCU heat source, and a controller to activate the TCU heat source and heat the fluid coolant to a pre-determined temperature if the measured temperature is below a pre-determined threshold. Therefore, if the fluid coolant is too cold, i.e. below its optimal temperature, the TCU heats it up before it is passed back past the heat source.

According to another aspect of the invention there is provided a method of cooling a heat source. The method comprises pumping a fluid coolant through a heat source, transferring thermal energy from the heat source to the coolant, pumping the coolant from the heat source to a heat exchanger, transferring thermal energy from the coolant to an encapsulated phase change material (PCM) incorporated within the heat exchanger, and transferring thermal energy from the encapsulated PCM to the heat dump. This provides an efficient way of transferring the thermal energy from the fluid coolant to a PCM, increasing the efficiency of the thermal management system.

In one example, the method further comprises pre-heating the coolant to a predetermined temperature before passing the fluid coolant past heat source. The pre-heating of the coolant (to a pre-determined temperature) improves the efficiency of the coolant to absorb thermal energy from the heat source. Preferably, transferring thermal energy from the coolant to the encapsulated PCM incorporated within the heat exchanger cools the fluid coolant to below the pre-determined temperature.

FIGURES

The invention may be performed in various ways and specific examples will now be described with reference to the accompanying drawings, in which.

Figure 4A:
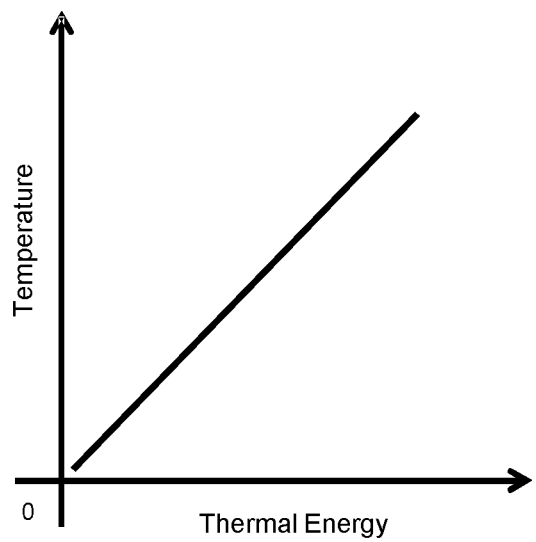
Figure 4B:
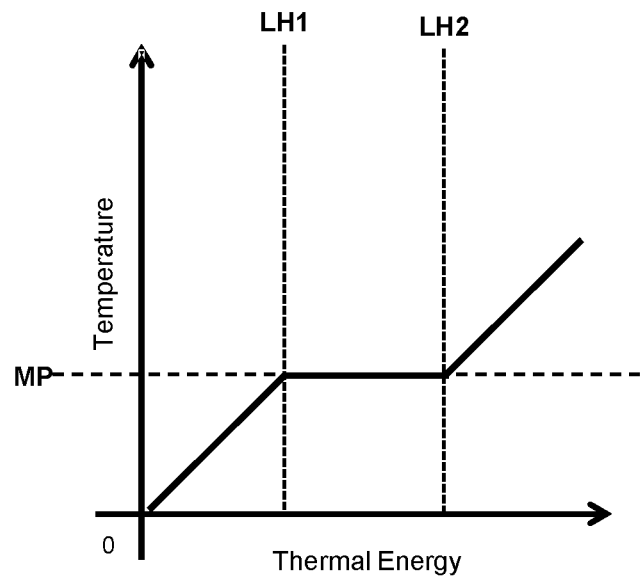
Figure 5A:
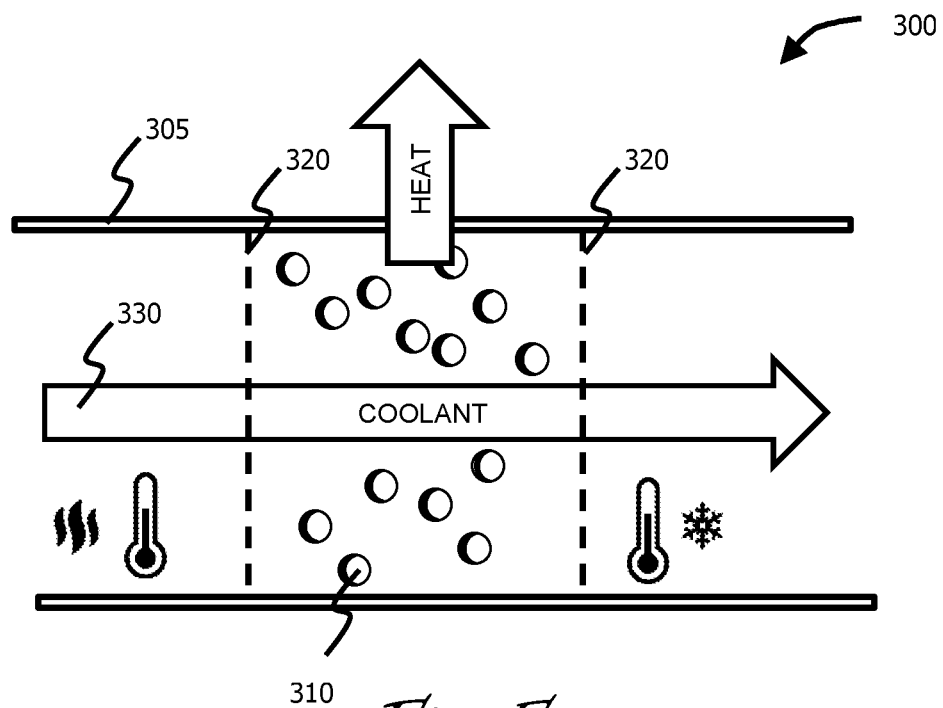
Figure 5B:
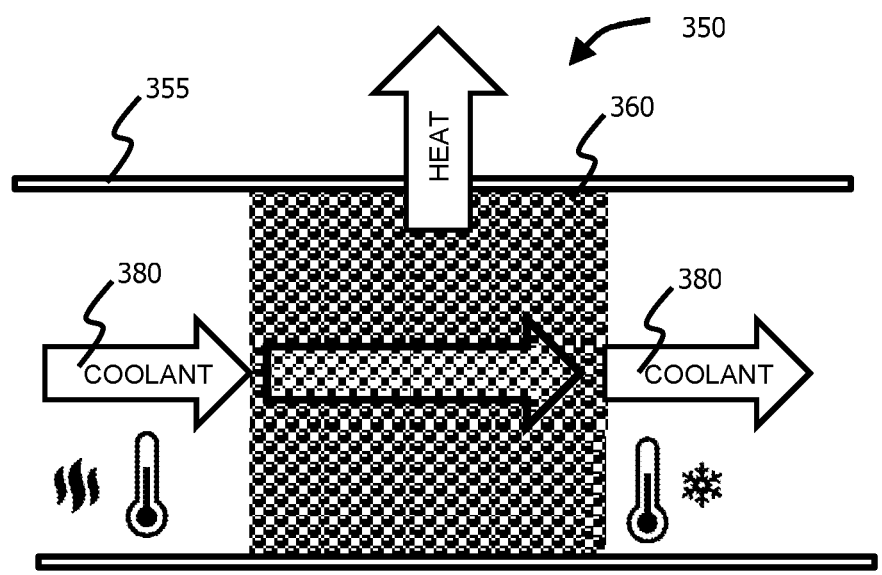
Figure 6:
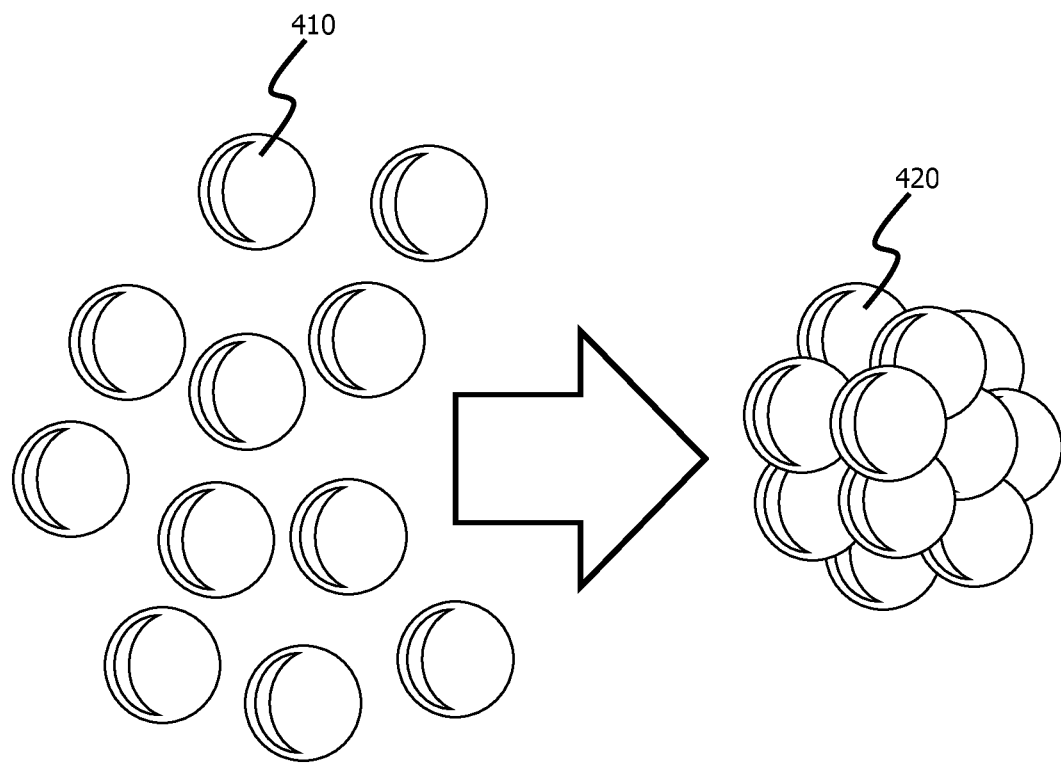
Figure 7:
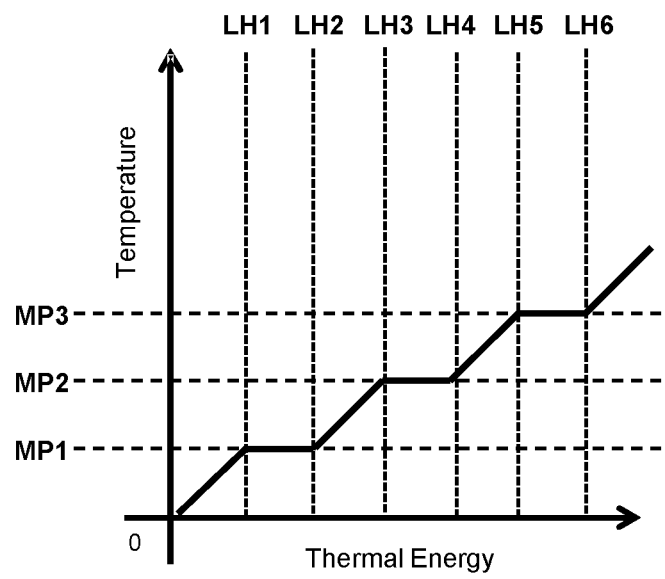
Figure 8:
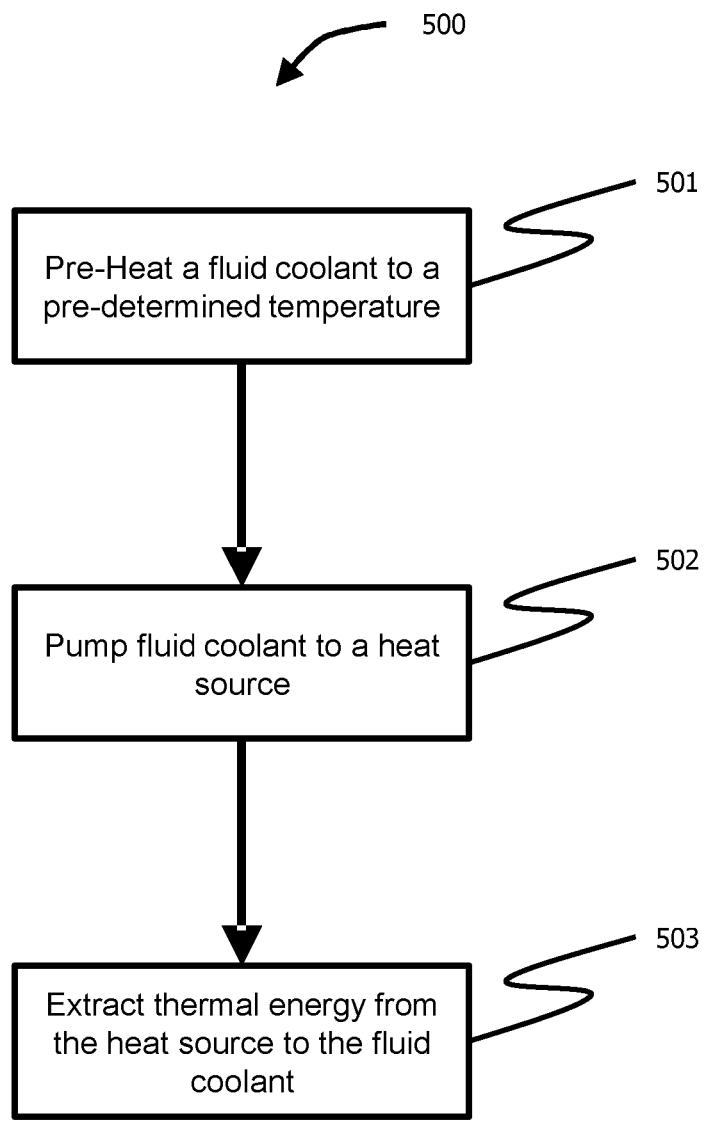
Figure 9:
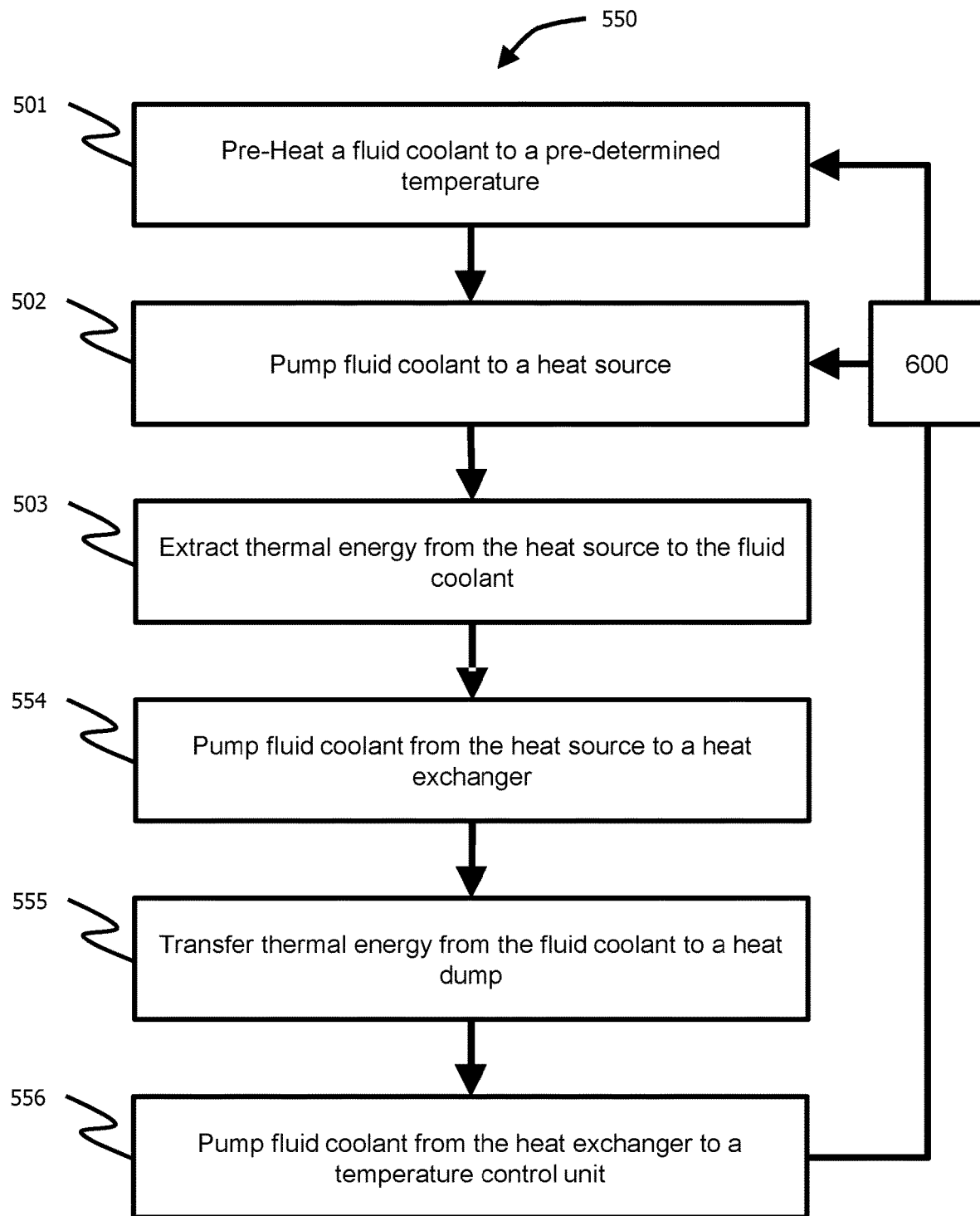
Figure 10:
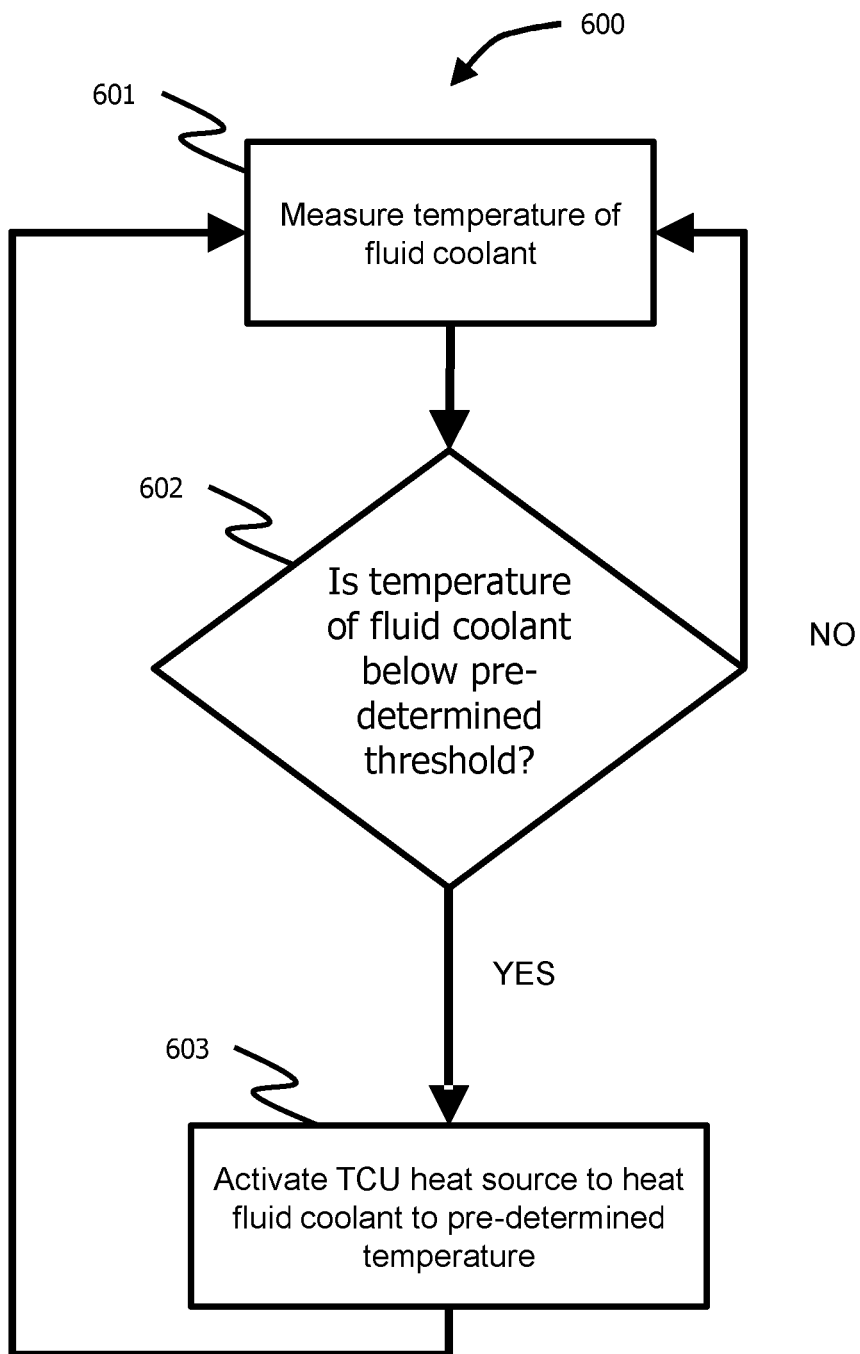

FIGS. 4*a* and 4*b* show an example temperature-energy relationship of two types of coolant;

FIGS. 5*a* and 5*b* show a schematic view of example heat exchanger arrangements;

FIG. 6 is schematic view of an example coolant;

FIG. 7 shows an example temperature-energy relationship of another type of coolant;

FIG. 8 shows a flowchart of an example method;
FIG. 9 shows a flowchart of another example method; and
FIG. 10 shows a flowchart of a further example method.

DETAILED DESCRIPTION

Figure 1:
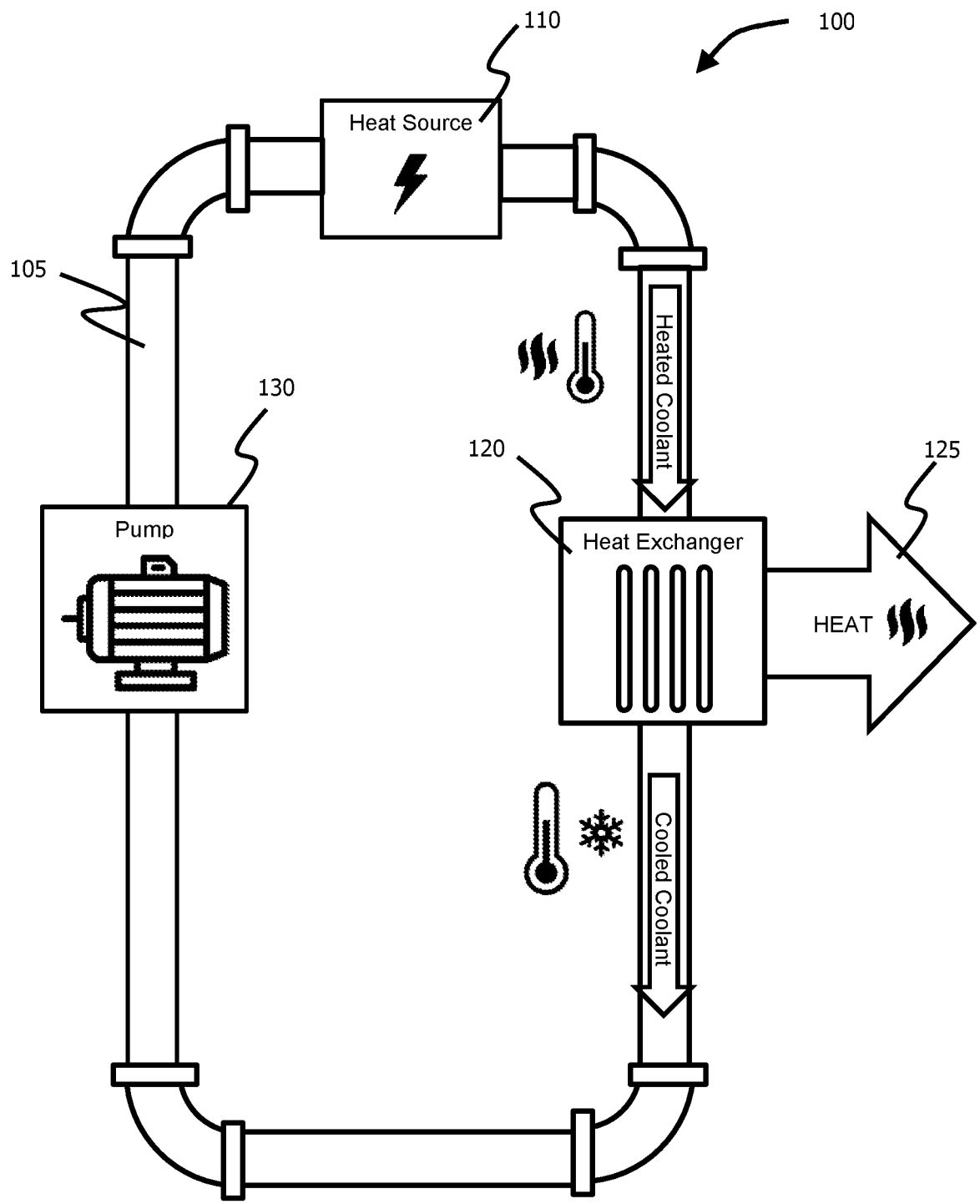
FIG. 1 is a schematic view of an example thermal management system known in the art.

FIG. 1 shows a schematic view of an example thermal management system 100 known to the art. During operation, a thermal load or heat source 110, for example an electronic device, generates excess heat. Coolant, typically a fluid i.e. liquid or gas, is used to reduce or regulate the temperature of the system 100 and the heat source 110. Ideally, the coolant used has high thermal capacity so as to be able to absorb and transfer large amounts of thermal energy from the heat source 110. A common example of a coolant is water. Other examples include water-glycol and oil-based fluids. A coolant may maintain its state of matter (e.g. stay liquid or gas) during the cooling process, or the coolant can undergo a phase transition, i.e. changing from one state of matter to another, with latent heat adding to the cooling efficiency. Latent heat is thermal energy which allows a substance, e.g. the coolant, to change state without changing the temperature of the substance. In contrast to latent heat, "sensible heat" involves an energy transfer that results in a temperature change of the system, and is the most common form of heat storage. In an example where the coolant is water, transferring heat from a heat source may cause the initially liquid coolant to transition into a gas, i.e. steam.

During operation, coolant is transferred around the closed-loop system 100 along coolant pipes 105 by a pump 130. The coolant flows past or through the heat source 110, which in the example shown is an electronic device. The coolant extracts/absorbs thermal energy from the device 110, cooling the device 110, and subsequently the coolant carries the thermal energy away from the device 110 to the heat exchanger 120. The heat exchanger 120 extracts the thermal energy from the coolant, and the coolant exits the heat exchanger 120 as cooled fluid, whilst the thermal energy is transferred to a heat dump, i.e. expelled through an exhaust 125.

Figure 2:
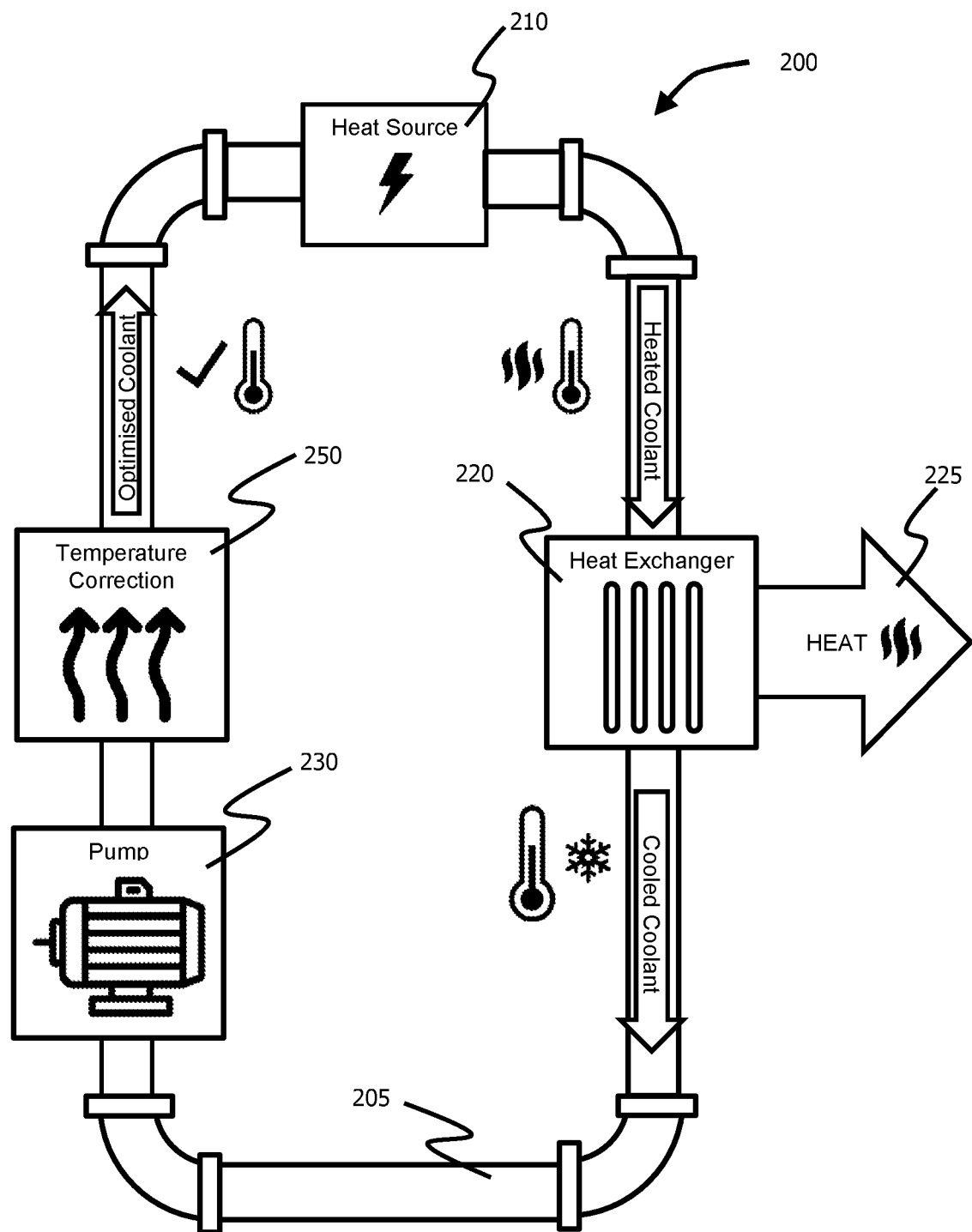
FIG. 2 is a schematic view of an example thermal management system.

FIG. 2 shows an example of a thermal management system 200 adapted to control the temperature of a heat source 210, such as an electronic device. During operation of the device 210, excess heat is generated. Coolant is pumped around the closed-loop system 200 though a system of coolant pipes 205 by a pump 230. The coolant flows past, around or through the electronic device 210 and extracts/absorbs thermal energy from the device 210. The thermal energy generated by the device 210 is transferred away in the (heated) fluid coolant to a heat exchanger 220, thus cooling the device 210. The cooling pipes 205 may be surrounded by, abutted to or placed near the heat exchanger 220 to allow the thermal energy gathered as the cooling fluid passed the heat source 210, to be transferred away from the fluid coolant (thus cooling the fluid coolant). The heat exchanger 220 expels the extracted thermal energy through an exhaust 225. The (cooled) fluid coolant exits the heat exchanger 220 ready to be pumped back round the closed loop system 200 to the device 210 again. In one example, the fluid coolant may be pumped to a different cooling system.

Modern electronic devices are increasingly sensitive and even slight temperature variations either above or below the optimal operational thermal threshold can adversely affect the device performance. Therefore it is imperative that such devices are maintained within an acceptable operational thermal margin. As discussed, coolants can be used to help reduce or regulate the temperate of a device. However, the effectiveness of a coolant, e.g. its ability to absorb/transmit thermal energy, is influenced by the temperature of the coolant itself and therefore it is also important to maintain the coolant within an optimal temperature range so as to achieve efficient cooling of a heat source. If the coolant is too hot, or too cold, the thermal conductivity is reduced, thus decreasing the coolant's ability to absorb thermal energy from a heat source, and the device being cooled may overheat.

Figure 3:
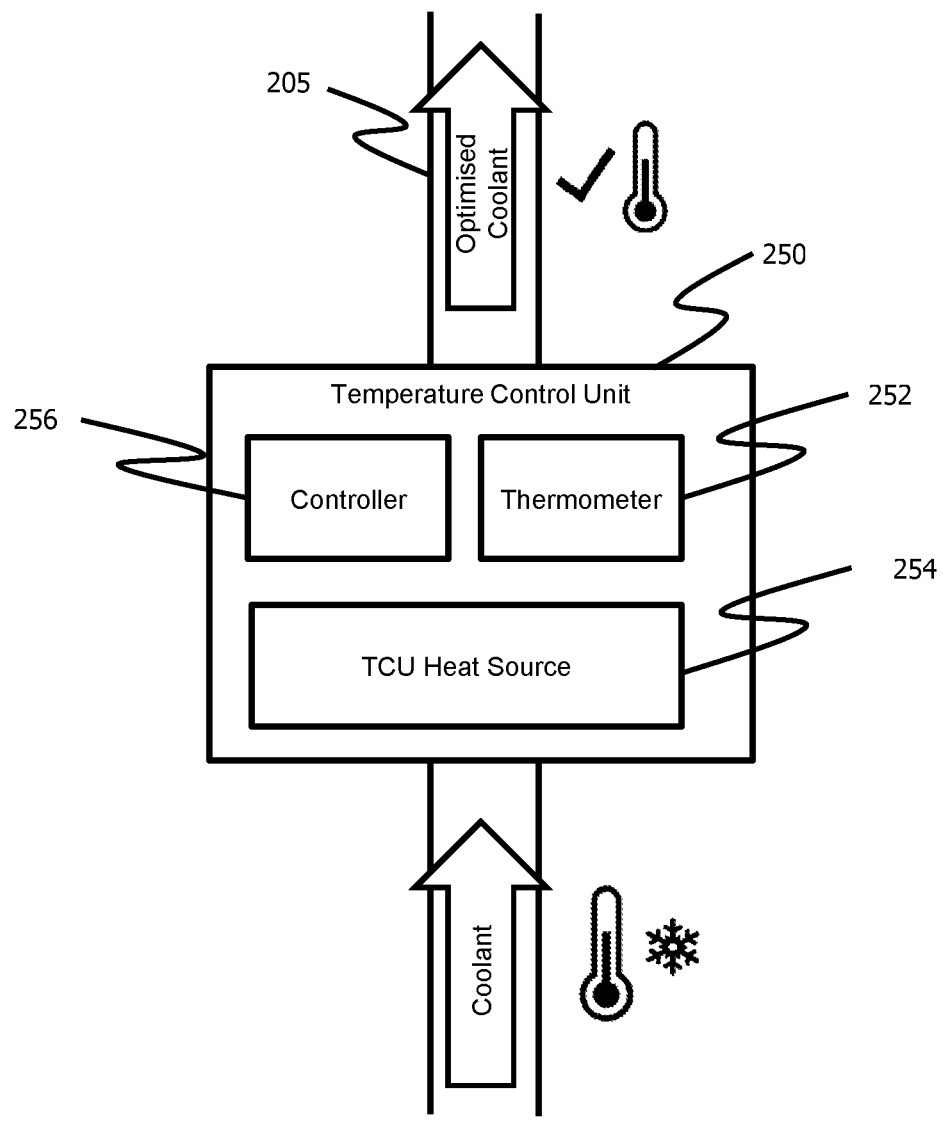
FIG. 3 is a schematic view of an example temperature control unit.

In one example, the thermal management system 200 also comprises a temperature control unit (TCU) 250. The TCU 250 is located on the closed loop at a position after the heat exchanger 220 and before the heat source 210, e.g. an electric device. As shown in FIG. 3, the TCU 250 comprises a temperature monitoring device 252 (e.g. a thermometer), a controller 256, and a TCU heat source 254. During operation of the thermal management system 200, after extracting thermal energy from the heat source 210, the coolant is cooled by the heat exchanger 220 to a temperature deliberately below the optimal temperature for the coolant. The coolant is pumped around the system 200 through the coolant pipes 205, and the coolant enters the TCU 250, the TCU measures the coolant temperature with the temperature monitoring device 252. If the coolant temperature is below the optimal operational temperature for the coolant, the controller 256 activates the TCU heat source 252 to heat up the coolant to the desired temperature, i.e. the optimal temperature for cooling the electronic device 210. It is easier to heat the coolant to a desired temperature, i.e. the optimal temperature for cooling the electronic device 210, than it would be to cool it down to the desired temperature. Therefore the coolant temperature can be more finely controlled, and the efficiency of the thermal management system 200 is improved. Accurate control of the temperature of the coolant is also important when the coolant incorporates phase change materials, as described in more detail below.

In another example, the thermal management system incorporates a phase change material (PCM). PCMs melt and solidify (i.e. change state) at a certain temperature, and are capable of: storing thermal energy as the PCM transforms from a solid to a liquid state; and releasing energy as the PCM transforms from a liquid to a solid state. PCMs store latent heat, i.e. thermal energy released or absorbed during a constant-temperature process, e.g. such as a first-order phase transition. Latent heat is thermal energy which allows the change of state of a substance without changing its temperature. In contrast to latent heat, "sensible heat" involves a thermal energy transfer that results in a temperature change of the system, and is the most common form of heat storage. Examples of such PCMS include ice/water (which melts/solidifies at 0° C.), wax (e.g. paraffin wax) and salt hydrides (also known as ionic or saline hydrides). Waxes can be formulated with a range of melting points (approximately between −10° C. and +90° C.).

FIG. 4a is a graph showing the relationship between the temperature of a sensible heat storage material and the thermal energy supplied to it. Any thermal energy transferred to the sensible heat storage medium results in a temperature increase of the storage medium. An example of a sensible heat storage medium is water, wherein transferring thermal energy to water results in the temperature of the water increasing. Transferring thermal energy away from water would result in the water cooling.

FIG. 4b is a graph showing the relationship between the temperature of a latent heat storage material, such as a PCM, and the thermal energy supplied to it. As thermal energy is transferred to the PCM, the temperature of the PCM increases until the PCM reaches its melting/freezing temperature (MP) (point LH1). At this point, the PCM experiences a change in state from a solid to a liquid. In some examples, the MP of the PCM is approximately 10° C. to 40° C. During the phase transition from a solid to a liquid (between points LH1 and LH2), latent heat (i.e. thermal energy) is stored by the PCM, but the temperature of the PCM does not increase and remains at the melting point (MP). Once the PCM has fully changed state from a solid to a liquid (point LH2), no more latent heat is stored, and sensible heat storage begins again, i.e. the increase in PCM temperature resumes as thermal energy is supplied to the PCM.

In one example, PCMs are incorporated into the fluid coolant, wherein the coolant comprises a carrier fluid. The carrier fluid may be water based (e.g. water, or water glycol (ethylene or propylene)) or oil based (e.g. polyalphaolefin (PAO) or silicate esters). PCM particles or capsules are suspended in the carrier fluid. In some examples, the particles are each approximately 1-50 μm diameter. The preferable size range may be limited due to stability thresholds encountered during the standard production process. The carrier fluid works with the PCMs to provide enhanced heat transfer capabilities of the resulting coolant when compared to a simple fluid alone, since the latent heat storage of the PCM allows the coolant to extract, store and move thermal energy from a heat source.

In one example, the PCM may be encapsulated in an outer resin or shell to ensure that the PCM maintains its shape and/or location during its change of state. Examples of such encapsulating materials include thermosetting plastics, such as melamine formaldehyde (MF) or polyurethane (PU).

In one example, encapsulated PCMs are suspended in a carrier fluid, and free to flow without confinement throughout the coolant pipes 205 of a thermal management system, such as that shown in FIG. 2. Both the suspended PCM and carrier fluid absorb thermal energy directly from the heat source 210, increasing the cooling effect compared to a simple fluid coolant alone. Like standard fluid coolants, the effectiveness of a PCM to absorb/transmit thermal energy is influenced by the temperature of the PCM. In order to maximise the thermal efficiency of the PCM to absorb thermal energy, it is important to maintain the PCM within an optimal temperature range, preferably just below the melting point of the PCM (e.g. MP in FIG. 4b), for example within 5° C. of the MP, and preferably within 2° C. of the MP, so as to achieve efficient cooling of a heat source. If the PCM is too cold, the thermal conductivity is reduced, thus decreasing the PCM's ability to absorb thermal energy from a heat source. In one example, the PCM-laced coolant may be cooled by a heat exchanger 220 to below the optimal operational temperature for thermal absorption (e.g. well below the MP of the PCM). The PCM-laced coolant may then be brought back up to an optimal temperature by a TCU 250 so as to provide optimal thermal extraction from a heat source 210.

FIG. 5a shows an example of an encapsulated PCM 310 suspended in a carrier fluid 330 within a coolant pipe 305. In some examples, the coolant pipe 305 could be a cooling tank, or other storage container or conduit suitable for thermal energy transfer. In this example, the encapsulated PCM 310 is confined by at least one porous mesh or membrane 320 that allows the fluid 330 to pass through or along the coolant pipe 305, but retains the particles 310 in a "PCM containment zone". In other words, the PCM particles are not able to pass through the membrane/mesh, but the fluid coolant 330 is. In FIG. 4a, the fluid 300 enters the PCM containment zone carrying thermal energy. The thermal energy is transferred to the encapsulated PCM particles 310 as the fluid 330 passes through, and the cooled coolant exits the PCM containment zone. The membrane or mesh 320 ensure that the PCM particles 310 are contained within a predetermined space within the coolant pipe 305, and the fluid 330 may flow freely through. The PCM particles 310 absorb the thermal energy contained in the fluid 330 by changing state from solid to liquid, within the encapsulation shell. The thermal energy is then expelled from the heat exchanger to an exhaust.

FIG. 5b shows another example of a heat exchanger arrangement 350, wherein at least one encapsulated PCM is incorporated into a porous mesh, membrane, matrix of cavities, or foam 360 material. In some examples, the porous mesh, membrane, matrix of cavities, or foam 360 is a polymer, such as polyester, polyether, or polyurethane, or a metal, such as aluminium, an alloy of aluminium, titanium, or steel. The coolant 380 is channelled via piping 355 through the PCM porous mesh, membrane, matrix of cavities, or foam 360, transferring thermal energy to the PCM suspended in the material, which is then expelled from the heat exchanger to an exhaust. The cooled coolant 380 then exits the heat exchanger 350.

In some examples, the thermal management system is coupled to a wider fuel system for another device, and the fluid coolant pumped around the system may be a fuel for the other device. In this example, it is important that any suspended PCM particles are constrained within a PCM containment zone, and not allowed to flow into the device engine or the wider system outside of the thermal management system, as this could cause damage to the wider system and/or device.

In another example, and as shown in FIG. 6, the encapsulated PCM particles 410 may be combined or incorporated into a polynuclear PCM, or PCM "molecule" 420. The resultant PCM molecule 420 is larger than a standard (single) particle, thus allowing for a coarser mesh or membrane 320 to be used in restraining the PCM within the carrier flow. In some examples, the polynuclear particles have a diameter in the 0.5-5 mm diameter range, allowing for a mesh with an example gap size of up to 0.4-4 mm in size (depending on the polynuclear particle size). The coarser mesh or membrane 320 provides less resistance to the coolant flow, and a smaller pump required in order to achieve the same rate of flow. In one example, the polynuclear PCM is formed through flocculation. In another example, the individual PCM particles may be bonded together by forming them into dies.

In some examples, the different types of heat exchanger as described above may be combined, e.g. comprising both a porous mesh 320 or membrane to constrain suspended encapsulated PCM particles 310, and a porous mesh, membrane, matrix of cavities, or foam 360 comprising encapsulated PCM, through which the fluid coolant 300 may flow. In one example, the fluid coolant 300 may comprise suspended PCM particles small enough to pass through the membrane or mesh etc. within the heat exchanger, wherein larger PCM particles (e.g. a polynuclear PCM) incorporated within the heat exchanger are contained.

In another example, the encapsulated PCM incorporated either in the heat exchanger, or within the carrier fluid as suspended particles, may comprise a blend or range of different PCMs of varying melting points. In one example, a single encapsulated particle comprises a single PCM having a set MP. Different particles within the suspended particles or incorporated into the heat exchanger may have different MPs to other encapsulated PCMs. Alternatively, in another example, a single encapsulated particle PCM particle may comprise a mix of PCMs within a single particle. In either example, a blend or range of PCMs incorporated into the heat exchanger or suspended in the carrier fluid provides the opportunity to customise the thermal response of the PCM, i.e. the heat capacity profile. The different PCMs (having different MPs) may be incorporated into a polynuclear PCM molecule 420, or individually within any of the examples outlined above, e.g. free flowing suspended particles, or incorporated into a mesh, membrane or matrix. The blend of PCMs provide a customised response to the thermal energy transfer and can be used to provide feedback about how much latent thermal capacity is left, e.g. providing warning levels.

FIG. 7 is a graph showing the relationship between the temperature of an example blended PCM material and the thermal energy supplied to it. As thermal energy is transferred to the blended PCM, the temperature increases until the blended PCM reaches its first melting/freezing temperature (MP1). At this point, the volume of the PCM with the lowest melting point experiences a change in state from a solid to a liquid, during which the temperature of the blended PCM does not increase and remains at the first melting point (MP1), between points LH1 and LH2. Once the first volume of PCM has fully changed state from a solid to a liquid, no more latent heat is stored, and sensible heat storage begins again, after LH2, i.e. the temperature of the PCM blend continues to increase as thermal energy is supplied to it. When the temperature of the blended PCM reaches the second melting point (MP2), latent heat storage begins again, at point LH3, when the second volume of PCM with the higher melting point than the first volume, begins to change from a solid to a liquid. During this time, the second temperature (MP2) is maintained until the second volume of PCM is fully changed from a solid to a liquid, at point LH4, whereupon sensible heat storage begins again. The temperature of the blended PCM increases again as thermal energy is supplied to it, until the upper melting point is reached (MP3), at which point (LH5) the remaining PCM begins to melt, during which the temperature (MP3) is maintained. Once all of the PCM is melted, at point LH6, sensible heating begins again.

FIG. 8 shows a flowchart of an example method 500 to be carried out in conjunction with the temperature control system 200 as described above. As discussed previously, if a coolant is too hot, or too cold, the thermal conductivity is reduced, thus decreasing the coolant's ability to absorb thermal energy from a heat source. It is easier to heat a coolant to a desired temperature than it is to cool it down to the desired temperature. Therefore, in one example, a coolant may be cooled by a heat exchanger to below the optimal operational temperature for thermal absorption (e.g. well below the MP of a PCM in a PCM-laced coolant). At step 501 of the example method, the fluid coolant is (pre)heated (from below a desired temperature) to a pre-determined temperature—i.e. the desired temperature for optimal thermal energy transfer from a heat source. At step 501, the fluid coolant is pumped to a heat source, and at step 503 the fluid coolant extracts/transfers thermal energy from the heat source.

FIG. 9 shows a flowchart of another example method 550, incorporating the steps of the method 500 shown in FIG. 8. After extracting thermal energy from the heat source in step 503, the method 550 further comprises pumping the fluid coolant from the heat source to a heat exchanger at step 554. The thermal energy is transferred from the fluid coolant to a heat dump (i.e. an exhaust) at step 555, and where possible, it is desirable to reduce the heat of the fluid coolant to below that of the desired level, i.e. the optimal temperature for cooling. The fluid coolant is then pumped from the heat exchanger to a temperature control unit at step 557. Whether the fluid coolant is subsequently re-heated to a desired pre-determined temperature by the temperature control unit, or is pumped straight to the heat source, is determined in step 600, as shown in FIG. 10.

At step 601 of the method step 600, the temperature monitoring device measures the temperature of the fluid coolant. The controller then determines whether the fluid coolant temperature is above or below a pre-determined threshold temperature at step 602. If the fluid coolant is above a pre-determined threshold temperature, i.e. at the optimal temperature or above, then the fluid coolant is pumped onto the heat source. If the fluid coolant is below the optimal temperature then at step 603 the controller activates a heat source in the TCU to heat the fluid coolant up to the desired (i.e. optimal temperature). In an example where the fluid coolant comprises a PCM, for example as encapsulated particles suspended in a carrier fluid, then the desired temperature for the fluid coolant is just below the melting point of the PCM. If there is a blend of multiple PCMs in the fluid coolant, then the desired temperature is just below the lowest melting point of the blend of PCMs In one example, the threshold temperature below which the TCU activates the TCU heat source to heat the fluid coolant is a different value to the desired temperature of the fluid coolant. In another example, the fluid coolant, having green pumped from one heat source, to a heat exchanger and a TCU, may be pumped through a different heat source subsequently.

In one implementation of the invention, the heat source is a high-load electrical device that is only operational for short bursts, and requires down-time between operating cycles. In this example, the electrical device requires efficient cooling to counter the generation of a large amount of thermal energy in a very short amount of time. The thermal management system must keep the electrical device cool during its short operational burst, and the thermal energy can be expelled in the periods between the operational bursts of the electrical device.

Although the invention has been described above with reference to one or more preferred examples, it will be appreciated that various changes or modifications may be made without departing from the scope of the invention as defined in the appended claims. Furthermore, whilst the examples within this description refer to electronic devices, it is explicitly acknowledged that the present thermal management system can be employed for a number of other uses, for example cooling high-energy mechanical heat sources, i.e. internal combustion engines. The examples described above may be combined in any order any maintain the technical benefits of the present invention.

The invention claimed is:

1. A thermal management system, comprising:
   a fluid coolant;
   a pump;
   a heat exchanger, wherein the heat exchanger comprises an encapsulated phase change material (PCM) through which the fluid coolant passes and a porous feature through which the fluid coolant flows; and
   a temperature control unit (TCU) through which the fluid coolant flows after the heat exchanger and before the heat source, the TCU including a controller to activate a TCU heat source to heat the fluid coolant, wherein the encapsulated PCM is incorporated as particles suspended in a flow of the fluid coolant, the particles having a size that prevents them from passing through the porous feature.

2. The thermal management system according to claim 1, wherein the porous feature comprises a porous foam incorporating the encapsulated PCM particles, through which the fluid coolant flows.

3. The thermal management system according to claim 1, wherein the porous feature comprises a porous matrix of cavities incorporating the encapsulated PCM particles, through which the fluid coolant flows.

4. The thermal management system according to claim 1, wherein the porous feature comprises a porous mesh incorporating the encapsulated PCM, through which the fluid coolant flows.

5. The thermal management system according to claim 1, wherein the encapsulated PCM particles comprise a plurality of PCM particles combined together.

6. The thermal management system according to claim 1, wherein:
   the thermal management system is coupled to a fuel system for a device; and
   the fluid coolant is a fuel source for the device.

7. The thermal management system according to claim 1, wherein more than one type of PCM is used, each different type of PCM having a different melting point.

8. The thermal management system according to claim 1, wherein the TCU comprises:
   a thermometer to measure the temperature of the fluid coolant,
   wherein the controller is configured to activate the TCU heat source based on the measured temperature.

* * * * *